(12) United States Patent
Umbach et al.

(10) Patent No.: US 9,741,639 B2
(45) Date of Patent: Aug. 22, 2017

(54) SEMICONDUCTOR CHIP, METHOD FOR PRODUCING A SEMICONDUCTOR CHIP AND METHOD FOR SOLDERING A SEMICONDUCTOR CHIP TO A CARRIER

(71) Applicant: Infineon Technologies AG, Neubiberg (DE)

(72) Inventors: Frank Umbach, Munich (DE); Niels Oeschler, Moehnesee (DE); Kirill Trunov, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 395 days.

(21) Appl. No.: 14/027,603

(22) Filed: Sep. 16, 2013

(65) Prior Publication Data

US 2014/0077376 A1    Mar. 20, 2014

(30) Foreign Application Priority Data

Sep. 17, 2012    (DE) .......................... 10 2012 216 546

(51) Int. Cl.
  *H01L 23/48*    (2006.01)
  *H01L 21/336*    (2006.01)
  (Continued)

(52) U.S. Cl.
  CPC ............. *H01L 23/48* (2013.01); *H01L 21/50* (2013.01); *H01L 24/29* (2013.01); *H01L 24/32* (2013.01);
  (Continued)

(58) Field of Classification Search
  CPC ............ H01L 23/3114; H01L 23/49805; H01L 24/01; H01L 33/48; H01L 2221/68313;
  (Continued)

(56) References Cited

U.S. PATENT DOCUMENTS

| 5,197,654 A * | 3/1993 | Katz ................... B23K 35/001 |
| | | 228/123.1 |
| 2002/0175403 A1* | 11/2002 | Sreeram ............... B23K 35/302 |
| | | 257/702 |

(Continued)

FOREIGN PATENT DOCUMENTS

| CN | 1321409 A | 11/2001 |
| CN | 1659633 A | 8/2005 |

*Primary Examiner* — Julio J Maldonado
*Assistant Examiner* — Moin Rahman
(74) *Attorney, Agent, or Firm* — Murphy, Bilak & Homiller, PLLC

(57) ABSTRACT

A semiconductor chip includes a semiconductor body and a chip metallization applied on the semiconductor body. The chip metallization has an underside facing away from the semiconductor body. The chip further includes a layer stack applied to the underside of the chip metallization and having a number $N1 \geq 1$ or $N1 \geq 2$ of first partial layers and a number $N2 \geq 2$ of second partial layers. The first partial layers and the second partial layers are arranged alternately and successively such that at least one of the second partial layers is arranged between the first partial layers of each first pair of the first partial layers and such that at least one of the first partial layers is arranged between the second partial layers of each second pair of the second partial layers.

13 Claims, 3 Drawing Sheets

(51) Int. Cl.
*H01L 21/50* (2006.01)
*H01L 23/00* (2006.01)

(52) U.S. Cl.
CPC .............. *H01L 24/83* (2013.01); *H01L 24/48* (2013.01); *H01L 24/73* (2013.01); *H01L 2224/2908* (2013.01); *H01L 2224/29111* (2013.01); *H01L 2224/29116* (2013.01); *H01L 2224/29118* (2013.01); *H01L 2224/29139* (2013.01); *H01L 2224/29144* (2013.01); *H01L 2224/29147* (2013.01); *H01L 2224/29155* (2013.01); *H01L 2224/32225* (2013.01); *H01L 2224/48091* (2013.01); *H01L 2224/48227* (2013.01); *H01L 2224/48472* (2013.01); *H01L 2224/73265* (2013.01); *H01L 2224/8381* (2013.01); *H01L 2224/83191* (2013.01); *H01L 2224/83385* (2013.01); *H01L 2224/92247* (2013.01); *H01L 2924/00014* (2013.01); *H01L 2924/0132* (2013.01); *H01L 2924/01322* (2013.01)

(58) Field of Classification Search
CPC ....... H01L 2223/54486; H01L 2224/01; H01L 2224/04105; H01L 2224/12105; H01L 2224/28105; H01L 2924/18301
See application file for complete search history.

(56) References Cited

U.S. PATENT DOCUMENTS

| | | | |
|---|---|---|---|
| 2005/0272244 A1* | 12/2005 | Wada | 438/614 |
| 2006/0006788 A1* | 1/2006 | Lee et al. | 313/495 |
| 2006/0234482 A1* | 10/2006 | Ploessl | H01L 24/33 438/538 |
| 2006/0267205 A1* | 11/2006 | Koerner | H01L 21/76846 257/762 |
| 2007/0025684 A1* | 2/2007 | Otremba | 385/147 |
| 2009/0079080 A1* | 3/2009 | Stecher | 257/762 |
| 2009/0261375 A1* | 10/2009 | Chen et al. | 257/99 |

\* cited by examiner

SEMICONDUCTOR CHIP, METHOD FOR PRODUCING A SEMICONDUCTOR CHIP AND METHOD FOR SOLDERING A SEMICONDUCTOR CHIP TO A CARRIER

PRIORITY CLAIM

This application claims priority to German Patent Application No. 10 2012 216 546.0, filed on 17 Sep. 2012, the content of said German application incorporated herein by reference in its entirety.

TECHNICAL FIELD

The invention relates to semiconductor chips and the soldering of semiconductor chips to a metallization of a carrier.

BACKGROUND

Diffusion soldering connections have been used for some time for soldering semiconductor chips to a metallization of a carrier. In this case, a metallization of a semiconductor chip is soldered to a metallization of a carrier using a solder. During the soldering process, metal from the metallizations of the semiconductor chip and of the carrier diffuses into the liquid solder and forms together with the latter after solidification one or more intermetallic phases having high strength and stability with respect to thermal cycling.

Since the diffusion process in which the metals from the metallizations of the semiconductor chip and of the carrier diffuse into the liquid solder takes up a not inconsiderable time for achieving an intermixing required for the formation of intermetallic phases, the processing times associated with the production of such soldering connections are very long. Moreover the concentration of the indiffused metals decreases with the distance from the respective metallizations of the semiconductor chip and of the carrier. This results in different stoichiometric compositions in different regions of the melt. This has the effect that after solidification the melt does not exclusively consist of intermetallic phases, but rather a considerable proportion of simple alloys which do not have a lattice structure and therefore do not constitute an intermetallic phase. Since commercial alloys have a lower strength and a lower stability with respect to thermal cycling in comparison with intermetallic phases, there is a need for an improved solution.

SUMMARY

According to an embodiment, a semiconductor chip comprises a semiconductor body, a chip metallization applied to the semiconductor body, and a layer stack applied to an underside of the chip metallization facing away from the semiconductor body. The layer stack has a number $N1 \geq 1$ or $N1 \geq 2$ of first partial layers, and a number $N2 \geq 2$ of second partial layers. The first partial layers and the second partial layers are arranged alternately successively such that at least one of the second partial layers is arranged between the first partial layers of each first pair of the first partial layers and such that at least one of the first partial layers is arranged between the second partial layers of each second pair of the second partial layers. Each of the first partial layers comprises an alloying metal or consists of an alloying metal. Each of the second partial layers comprises a solder or consists of a solder which can form an intermetallic phase with the alloying metal of the first partial layer adjoining the relevant second partial layer. Accordingly, "alloying metal" of a first partial layer is understood to mean a metal or an alloy which can form an intermetallic phase with at least one of the second partial layers adjoining said first partial layer. In this case, each of the first partial layers consists of a different material or a different material composition than a second partial layer adjoining said first partial layer.

In order to produce such a semiconductor chip, the layer stack is applied to the semiconductor body provided with the chip metallization by means of a respective one of the first partial layers and a respective one of the second partial layers being applied alternately successively. Any desired coating technique, for example sputtering, vapour deposition, deposition from the gas phase, electroplating, electroless deposition, including in any desired combinations with one another, can be used for this purpose.

For linking a prefabricated semiconductor chip, which has a construction like the semiconductor chip explained above, to a carrier, the chip metallization is connected to a surface section of a metallization of the carrier by the melting of the second partial layers having a low melting point and by a subsequent diffusion soldering process. The interdiffusion of metal atoms of the first partial layers and of metal atoms of the second partial layers and metal atoms of the surface section leads to the formation of intermetallic phases having a significantly increased melting point in comparison with the melting point or the melting points of the second partial layers having a low melting point.

Through the use of the layer stack having many thin solder-containing second partial layers having a low melting point, ideally an interdiffusion is achieved, thus giving rise to a connecting layer which connects the chip metallization to the surface section and at least 90% by volume of which consists of one or more intermetallic phases. Alternatively or additionally, the interdiffusion can lead to the formation of a connecting layer having one or more paths, each of which extends continuously between the chip metallization and the surface section of the metallization and consists completely of one or more intermetallic phases. In the case of a plurality of paths, they can also be spaced apart from one another in such a way that a section of the connecting layer that contains no intermetallic phases is situated between two arbitrary paths.

In contrast to the corresponding connections in the prior art, not only metal from the metallizations of the semiconductor chip and of the carrier but also the metal or metals from the first partial layers contributes to the formation of the intermetallic phase(s). The required diffusion distances and in association therewith the required soldering times are significantly reduced as a result.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
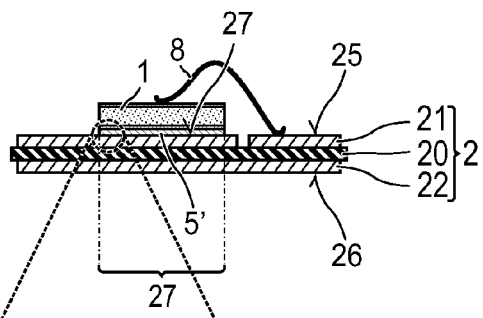
FIG. 1 shows a cross-sectional view through a composite assembly between a circuit carrier and a semiconductor chip.

FIG. 1 shows a cross section through a circuit carrier 2, onto which a semiconductor chip 1 is soldered. The circuit carrier 2 has an insulation carrier 20, for example a ceramic, which is provided with an upper metallization 21 and with an optional lower metallization 22. As illustrated, the upper metallization 21 can be structured to form conductor tracks and/or conductor areas. As an alternative to such a circuit carrier 2, however, generally a metallic leadframe can also be used as the circuit carrier 2.

Figure 2:
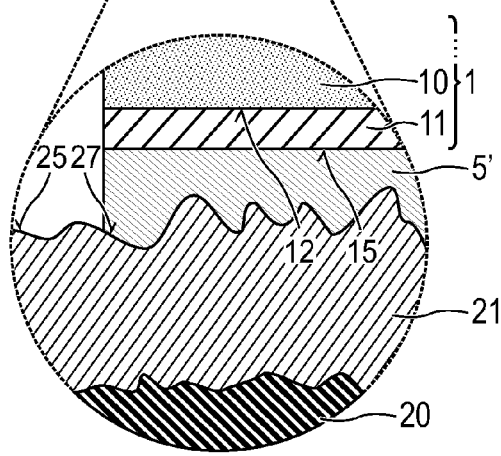
FIG. 2 shows an enlarged view of a region of the composite assembly shown in FIG. 1.

As can be discerned based on the enlarged region of the circuit carrier 2 shown in FIG. 2, the semiconductor chip 1 comprises a semiconductor body 10—merely illustrated schematically—composed of a semiconductor base material, for example silicon, silicon carbide, gallium arsenide or any other semiconductor material. A chip metallization 11 is provided on the underside 12 of the semiconductor body 10. The chip metallization 11 is a conventional chip metallization which can comprise one layer or of a plurality of partial layers, such as are usually used in semiconductor chip technology for the production of load connection metallizations. Such a load connection metallization can be, for example, a drain metallization, a source metallization, a collector metallization, an emitter metallization, an anode metallization or a cathode metallization of a power semiconductor component. The chip metallization 11 can be adapted in coordination with the connecting process described herein. In particular, layers required for conventional connecting techniques such as soldering can be dispensed with. By way of example, the use of nickel layers or nickel-containing layers can be dispensed with. On the other hand, it can be advantageous to use other or additional layers which prevent a reaction of the first solder layer with the chip metallization 11.

On its side facing away from the semiconductor body 10, the chip metallization 11 has an underside 15, the roughness of which is significantly lower than the roughness of the surface 25 of the upper metallization layer 21 of the circuit carrier 2. Therefore, it is advantageous if the quantity of a connecting material 5', by which the semiconductor chip 1 is cohesively connected to the upper metallization layer 21, is dimensioned such that no free spaces remain between the chip metallization 11 and the upper metallization layer 21. In other words, the quantity of the connecting material 5' used is dimensioned such that all irregularities of the surface 25 of the upper metallization layer 21 are compensated for.

In order to produce an arrangement as shown in FIGS. 1 and 2, the semiconductor chip 1 is connected by a chip mounting region 27 to the upper metallization layer 21 by means of a diffusion soldering process. The chip mounting region 27 is provided by that section of the surface 25 on which the semiconductor chip 1 is mounted. The area of the chip mounting section 27 is therefore substantially identical to the base area of the chip metallization 11.

Figure 3:
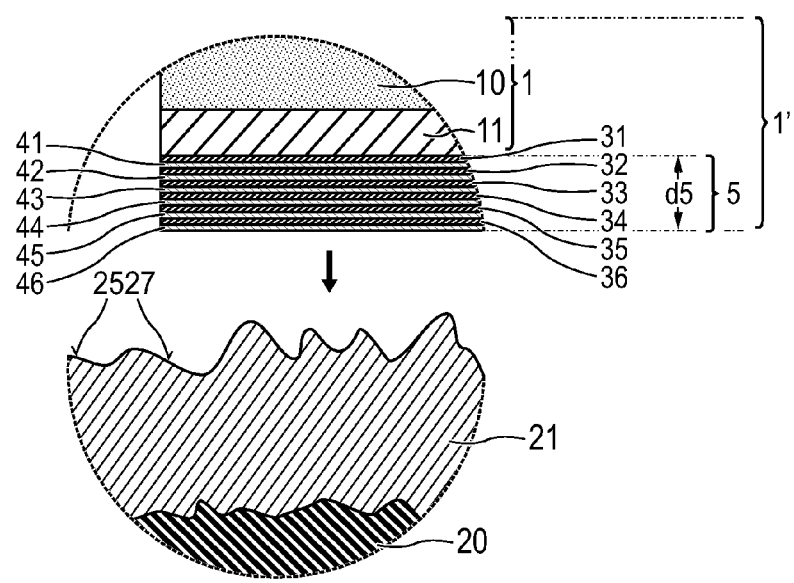
FIG. 3 shows the enlarged region of FIG. 2 before the semiconductor chip is soldered to the carrier.

As shown in FIG. 3, the semiconductor chip 1 is provided with a layer stack 5 before the semiconductor chip 1 is diffusion-soldered to the upper metallization layer 21. The layer stack 5 is applied to the underside 15 of the chip metallization 11 facing away from the semiconductor body 10.

The layer stack 5 comprises a number N1 of first partial layers 31-36, and a number N2 of second partial layers 41-46. In this case, the first partial layers 31-36 and the second partial layers 41-46 are arranged alternately and successively such that at least one of the second partial layers 41-46 is arranged between the first partial layers 31-36 of each first pair that can be formed from the first partial layers 31-36 and such that at least one of the first partial layers 31-36 is arranged between the second partial layers 41-46 of each second pair that can be formed from the second partial layers 41-46.

Each of the first partial layers 31-36 comprises an alloying metal or consists of an alloying metal. Furthermore, each of the second partial layers 41-46 comprises a solder or consists of a solder which can form an intermetallic phase with the alloying metal of at least one first partial layer 31-36 adjoining the said second partial layer 41-46.

On account of the construction of the layer stack 5, each of the second partial layers 41-46 adjoins at least one of the first partial layers 31-36, such that, during the subsequent soldering process in which the second partial layers 41-46 are melted, an alloying metal contained in the first partial layers 31-36 can diffuse into the relevant second partial layer 41-46 and can thereby contribute to the formation of an intermetallic phase after the solidification of the melt. The semiconductor chip 1 provided with the layer stack 5 therefore forms together with the layer stack 5 a modified semiconductor chip 1'.

As is indicated by an arrow in FIG. 3, the modified semiconductor chip 1' is placed onto the chip mounting region 27 for the purpose of soldering to the upper metallization layer 21. The layer stack 5 is then heated to an extent such that all the second partial layers 41-46 melt, with the result that, from the respectively adjoining first partial layers 31-36, metal can diffuse into the relevant melted second partial layer 41-46. After the diffusion soldering process has been concluded, a continuous intermetallic phase has formed, while the semiconductor chip 1' is situated unchanged on the chip mounting region 27, such that a fixed soldering connection arises between the semiconductor chip 1' and the upper chip metallization 21. As a result of the soldering process, the solder layer 5' illustrated in FIGS. 1 and 2 forms from the layer stack 5 and, if appropriate, from metal which diffused into the layer stack from the chip metallization 11 and the upper metallization layer 21, the solder layer 5' substantially consisting of intermetallic phases whose melting points are far above the melting point of the solder of the original second partial layers 41-46 and the maximum temperature used during the previous diffusion soldering process.

Figure 4A:
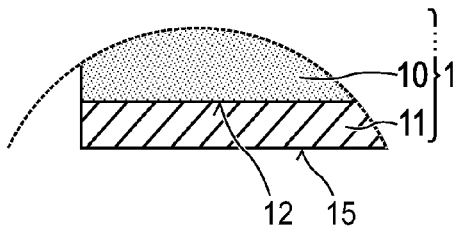
FIGS. 4A-4F show different steps of a method for manufacturing a semiconductor chip with a layer stack applied to the chip metallization of the semiconductor chip.

A method for manufacturing a semiconductor chip 1' provided with such a layer stack 5 is explained below with reference to FIGS. 4A to 4F. The starting point is a conventional semiconductor chip 1, as illustrated in FIG. 4A. The semiconductor chip 1 comprises a semiconductor body 10 having an underside 12. The underside 12 is provided with a chip metallization 11, which in turn has an underside 15 provided by that side of the chip metallization 11 which faces away from the semiconductor body 10. The chip metallization 11 can differ from conventional metallizations in that layers used for conventional connecting techniques are omitted or that additional buffer layers are used which stop the diffusion soldering process before reaching the semiconductor chip 1.

Figure 4B:
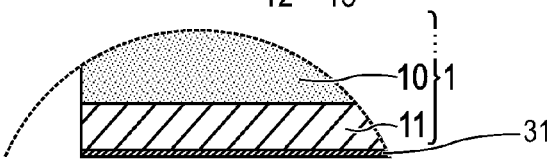
Figure 4C:
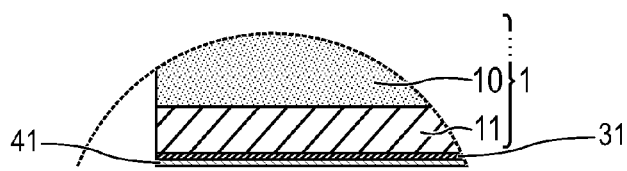
Figure 4D:
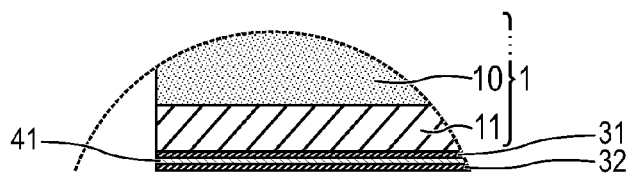
Figure 4E:
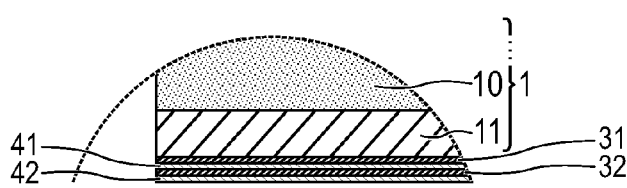

As shown in FIG. 4B, a first partial layer 31 is applied to the underside 15 of the chip metallization 11. Afterward, a second partial layer 41 is applied to that side of the first partial layer 31 which faces away from the semiconductor body 10, the resulting structure being shown in FIG. 4C. A further first partial layer 32 is then in turn applied to that side of the second partial layer 41 which faces away from the semiconductor body 10, the resulting structure being shown in FIG. 4D. There then follows in turn a further second partial layer 42, which is applied to that side of the further first partial layer 32 which faces away from the semiconductor body 10, the resulting structure being shown in FIG. 4E, etc.

Figure 4F:
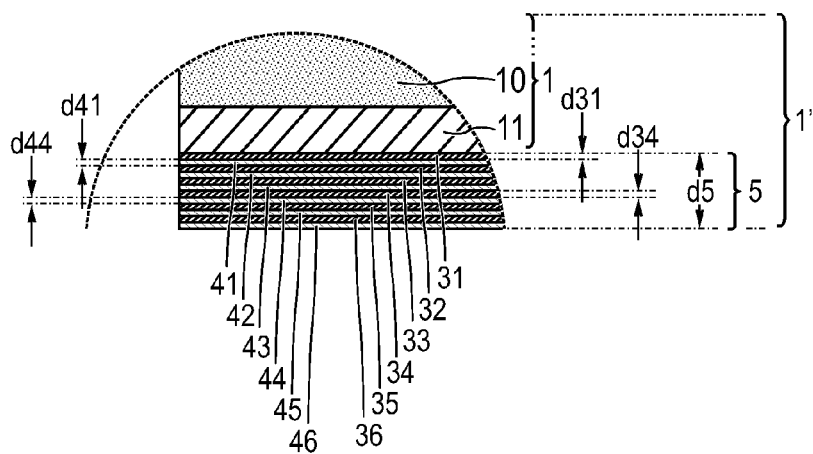

In this way, alternately, in each case a first partial layer, a second partial layer, a first partial layer, a second partial layer, etc. are successively applied onto one another, thus giving rise to a layer stack 5 as shown in FIG. 4F. Different methods, including in any desired combinations with one another, can be used for applying the first partial layers 31-36 and second partial layers 41-46 to the chip metallization 11. Suitable methods are, for example, sputtering, vapour deposition, deposition from the gas phase, electroplating or electroless deposition.

Figure 5:
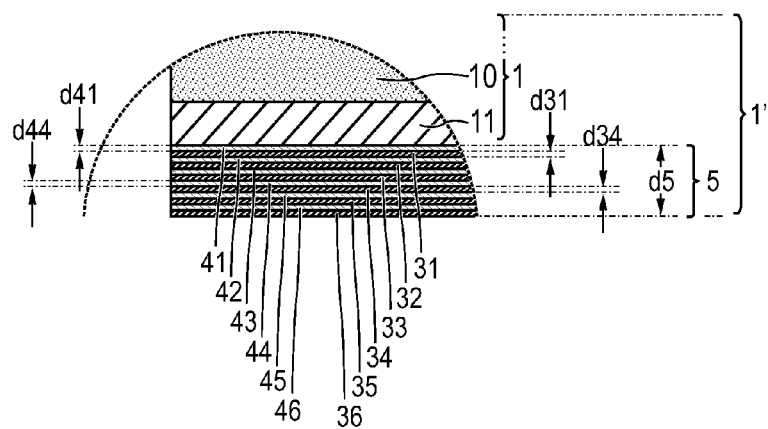
FIG. 5 shows a semiconductor chip with a layer stack applied to the chip metallization of the semiconductor chip, wherein a partial layer of the layer stack which is closest to the semiconductor body is a second partial layer.

In the example shown, that partial layer from among the partial layers of the layer stack 5 which is closest to the chip metallization 11 is a first partial layer 31. As an alternative thereto, however, the first partial layer applied to the chip metallization 11 could be a second partial layer 41, this being shown by way of example in FIG. 5.

Irrespective of whether that partial layer from among the partial layers 31-36, 41-46 of the layer stack 5 which is closest to the semiconductor chip 1 is a first partial layer 31 or a second partial layer 41, each of the first partial layers 31-36 and each of the second partial layers 41-46 has, as measured perpendicularly to the underside 15 of the chip metallization 11, a thickness which can be set during the production process. The thicknesses d31 and d34 of the first partial layers 31 and 34 respectively, and the thicknesses d41 and d44 of the second partial layers 41 and 44, respectively, are depicted merely by way of example in FIGS. 4F and 5. The thicknesses of the first partial layers 31-36 among one another, of the second partial layers 41-46 among one another, and the thicknesses of the first partial layers 31-36 in relation to the thicknesses of the second partial layers 41-46 can be chosen independently of one another, in principle. In this regard, by way of example, the thickness of each of the first partial layers 31-36 can be less than or equal to 10 μm or less than or equal to 5 μm. Independently thereof, each of the second partial layers 41-46 can have a thickness of less than or equal to 10 μm or of less than or equal to 5 μm. Moreover, the sum of the thicknesses d31-d36 of all the first partial layers 31-36 of the layer stack 5 can be less than or equal to 20 μm. Independently thereof, the sum d5 of the thicknesses d31-d36 of all the first partial layers 31-36 and of all the second partial layers 41-46 of the layer stack 5, i.e. the thickness d5 of the layer stack 5, can be at least 0.5 μm and/or less than or equal to 20 μm.

The thicknesses d31-d36 of all the first partial layers 31-36 of the layer stack 5 and the thicknesses of all the second partial layers 41-46 of the layer stack 5 can be co-ordinated with one another in such a way that they alloy to form intermetallic phases during the diffusion soldering process in an optimum manner and in minimal time.

The total thickness d5 of the finished layer stack 5 can be adapted to the surface roughness of the chip mounting area 27 of the upper metallization 21. Moreover, the thickness d5 of the finished layer stack 5 can be at most twice the surface roughness of the chip mounting area 27, in order to prevent the thickness of the connecting layer 5 produced from being significantly greater than is required for compensating for the surface roughness of the chip mounting area 27. In this case, all indications regarding the surface roughness of the chip mounting region 27 refer to the averaged roughness depth Rz according to EN ISO 4287.

For manufacturing engineering reasons, it can be advantageous to produce all the first partial layers from the same material. Correspondingly, it can be advantageous to produce all the second partial layers 41-46 from the same material, which, however, differs from the material of the first partial layers. In principle, however, different first partial layers 31-36 can consist of different materials. Independently thereof, the same correspondingly also applies to different second partial layers 41-46. The number N2 of the second partial layers 41-46 of the layer stack 5 can be at least 2 or at least 3, for example. Since the production costs rise with a very high number of partial layers, it can additionally be expedient if the number N1+N2 of all the first and second partial layers 31-36, 41-46 is chosen to be less than or equal to 11.

In the case of one, more than one or each of the first partial layers 31-36 of the layer stack 5, the alloying metal can be copper (Cu), nickel (Ni), silver (Ag) or gold (Au).

Furthermore, the solder of one, more than one or each of the second partial layers 41-46 of the layer stack 5 can comprise one of the following materials or can consist of one of the following materials: tin (Sn); tin-silver (SnAg) or gold-tin (AuSn) or further tin, zinc, or lead alloys.

The soldering of the modified semiconductor chip 1' to the upper metallization 21 can be effected, for example, by only the second partial layers 41-46, but not the first partial layers 31-36 being melted during the soldering process. For this purpose, each of the second partial layers 41-46 can have a melting point that is lower than the melting point of each of the first partial layers 31-36. By way of example, each of the second partial layers 41-46 can have a melting point of less than or equal to 250° C. in the case of Sn solders or less than 300° C. in the case of AuSn solder. In this case, the process temperature can be chosen to be lower than the melting point of that intermetallic phase from among the intermetallic phases that form which has the lowest melting point. The process temperature can be chosen to be lower than 450° C., for example.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor chip, comprising:
   a chip metallization applied on the semiconductor body and having an underside facing away from the semiconductor body; and
   a layer stack directly contacting the underside of the chip metallization and having a number $N1 \geq 2$ of first partial layers and a number $N2 \geq 2$ of second partial layers,
   wherein the first partial layers and the second partial layers are arranged alternately and successively such that at least one of the second partial layers is arranged between the first partial layers of each first pair of the first partial layers and such that at least one of the first partial layers is arranged between the second partial layers of each second pair of the second partial layers, wherein each of the first partial layers comprises an alloying metal, wherein each of the second partial layers comprises a solder which can form an intermetallic phase with the alloying metal of the first partial layer adjoining that second partial layer, the intermetallic phase formed by an interdiffusion of metal atoms of the first partial layers and of metal atoms of the second partial layers, the intermetallic phase having a melting point significantly higher than a melting point of the second partial layers.

2. The semiconductor chip of claim 1, wherein the partial layer from among the first and second partial layers which is closest to the semiconductor body is one of the first partial layers.

3. The semiconductor chip of claim 1, wherein the partial layer from among the first and second partial layers which is closest to the semiconductor body is one of the second partial layers.

4. The semiconductor chip of claim 1, wherein each of the first partial layers has a thickness of less than or equal to 10 μm.

5. The semiconductor chip of claim 1, wherein each of the second partial layers has a thickness of less than or equal to 10 μm.

6. The semiconductor chip of claim 1, wherein each of the second partial layers has a melting point of less than or equal to 300° C.

7. The semiconductor chip of claim 1, wherein N2 is at least 3.

8. The semiconductor chip of claim 1, wherein the alloying metal of one, more than one or each of the first partial layers comprises one of: copper (Cu); nickel (Ni); silver (Ag); and gold (Au).

9. The semiconductor chip of claim 1, wherein the solder of one, more than one or each of the second partial layers comprises one of: tin (Sn); tin-silver (SnAg); gold-tin (AuSn); or an alloy comprising one, two or three of tin, zinc and lead.

10. The semiconductor chip of claim 1, wherein each of the second partial layers has melting point that is lower than the melting point of the first partial layer closest to that second partial layer.

11. The semiconductor chip of claim 1, wherein all of the first partial layers consist of the same material.

12. The semiconductor chip of claim 1, wherein all of the second partial layers consist of the same material.

13. The semiconductor chip of claim 1, wherein the layer stack has a thickness between 0.5 μm and 20 μm.

* * * * *

UNITED STATES PATENT AND TRADEMARK OFFICE
CERTIFICATE OF CORRECTION

PATENT NO. : 9,741,639 B2
APPLICATION NO. : 14/027603
DATED : August 22, 2017
INVENTOR(S) : F. Umbach et al.

It is certified that error appears in the above-identified patent and that said Letters Patent is hereby corrected as shown below:

In the Claims

Column 7, Line 26 & 27 (Claim 1, Line 19 & 20), please change intermettalic" to -- intermetallic --.

Column 8, Line 26 (Claim 10, Line 2), please change "has melting" to -- has a melting --.

Signed and Sealed this
Seventh Day of November, 2017

Joseph Matal
*Performing the Functions and Duties of the*
*Under Secretary of Commerce for Intellectual Property and*
*Director of the United States Patent and Trademark Office*